(12) United States Patent
Marathe

(10) Patent No.: US 6,476,498 B1
(45) Date of Patent: Nov. 5, 2002

(54) ELIMINATION OF FLUX DIVERGENCE IN INTEGRATED CIRCUIT INTERCONNECTS

(75) Inventor: Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/905,435

(22) Filed: Jul. 13, 2001

(51) Int. Cl.$^7$ .................... H01L 23/48; H01L 23/52; H01L 29/40
(52) U.S. Cl. .................. 257/775; 257/758; 257/753; 257/774; 438/622; 438/629; 438/638; 438/687
(58) Field of Search ................. 438/687, 688, 438/638, 627, 628, 629, 622; 257/758, 761, 762, 763, 764, 765, 774, 775, 750, 751, 752, 753

(56) References Cited

U.S. PATENT DOCUMENTS

| | | | | |
|---|---|---|---|---|
| 5,589,713 A | * | 12/1996 | Lee et al. | 257/751 |
| 5,972,786 A | * | 10/1999 | Hoshino et al. | 438/627 |
| 6,157,078 A | * | 12/2000 | Lansford | 257/734 |

* cited by examiner

Primary Examiner—Tuan H. Nguyen
Assistant Examiner—Thanhha Pham
(74) Attorney, Agent, or Firm—Mikio Ishimaru

(57) ABSTRACT

An integrated circuit and manufacturing method therefor is provided having a semiconductor substrate with a semiconductor device. A dielectric layer is formed on the semiconductor substrate and an opening is formed in the dielectric layer. A barrier layer is deposited to line the opening which is optimized to reduce current crowding by resistance changes and/or being thicker at the bottom and sidewalls of a via. A conductor core is then deposited to fill the channel opening over the barrier layer.

10 Claims, 2 Drawing Sheets

ELIMINATION OF FLUX DIVERGENCE IN INTEGRATED CIRCUIT INTERCONNECTS

TECHNICAL FIELD

The present invention relates generally to semiconductor technology and more specifically to via-channel failures in integrated circuit interconnects.

BACKGROUND ART

In the manufacture of integrated circuits, after the individual devices such as the transistors have been fabricated in and on a semiconductor substrate or wafer, they must be connected, or "wired", together to perform the desired circuit functions. This interconnection process is generally called "metallization" and is performed using a number of different photolithographic, deposition, and removal processes to create contacts to the transistors, wire/channels to the contacts, and vias interconnecting the channels where there are more than one level of channels.

There are a number of different metalization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer on the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed on the first channel stop layer. Where the first channel dielectric layer is of an oxide material, such as silicon oxide (SiO$_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited on the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide and silicon nitride. This diffusion can result in a conductive buildup and cause short circuits in the integrated circuits. To prevent diffusion, a diffusion barrier is deposited on the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is electroplated on the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first channel dielectric layer so the materials and layers are coplanar with the dielectric layer. The CMP process leaves the first conductor "inlaid" in the first channel dielectric layer to form the first channels. When a thing dielectric layer is placed over the first channels as a final layer, it is called a "capping" layer and the single damascene process is completed. When the layer is processed further for placement of additional channels over it, the layer is a via stop layer.

In another technique called the "dual damascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited on the barrier layer and lines the barrier layer in the second channel openings and the vias.

A second conductor material is electroplated on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which are very difficult to etch.

A major problem occurs with void nucleation near the via/channel interface. At this interface, nucleation is at its highest because the flux divergence site coincides with the point where maximum current crowding and electromigration occurs. In void nucleation, a small void grows into a larger void due to atomic movement of conductor material or due to electric current flow where there is a sudden change in direction. As voids increase in size, increased circuit resistance occurs and large enough voids can lead to open circuits, causing the integrated circuit to fail. This is particularly problematic when copper is used in the channel because shunt layers have not been used with this conductor material.

Solutions to this problem have been long sought but have long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric layer. A barrier layer is deposited to line the opening which is optimized to reduce current crowding by resistance changes and/or being thicker at the bottom and sidewalls of a via. This results in elimination of the formation of voids and increased resistance to electromigration and increases the mean time to failure. A conductor core is then deposited to fill the channel opening over the barrier layer.

The present invention further provides an integrated circuit having a semiconductor substrate with a semiconductor device. A dielectric layer is on the semiconductor substrate and has an opening provided therein. A barrier layer lines the opening which is optimized to reduce current crowding by resistance changes and/or being thicker at the bottom and sidewalls of a via. This results in elimination of the formation of voids and increased resistance to electromigration and increases the mean time to failure. A conductor core fills the opening over the barrier layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
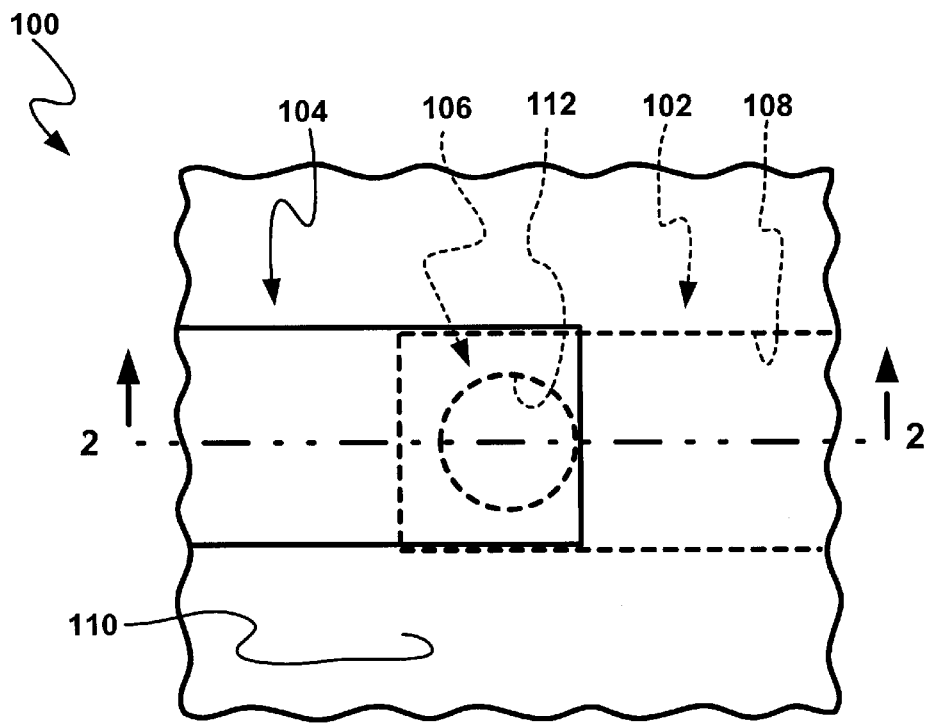
FIG. 1 (PRIOR ART) is a plan view of aligned channels with a connecting via.

Referring now to FIG. 1 (PRIOR ART), therein is shown a plan view of a semiconductor wafer 100 including a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
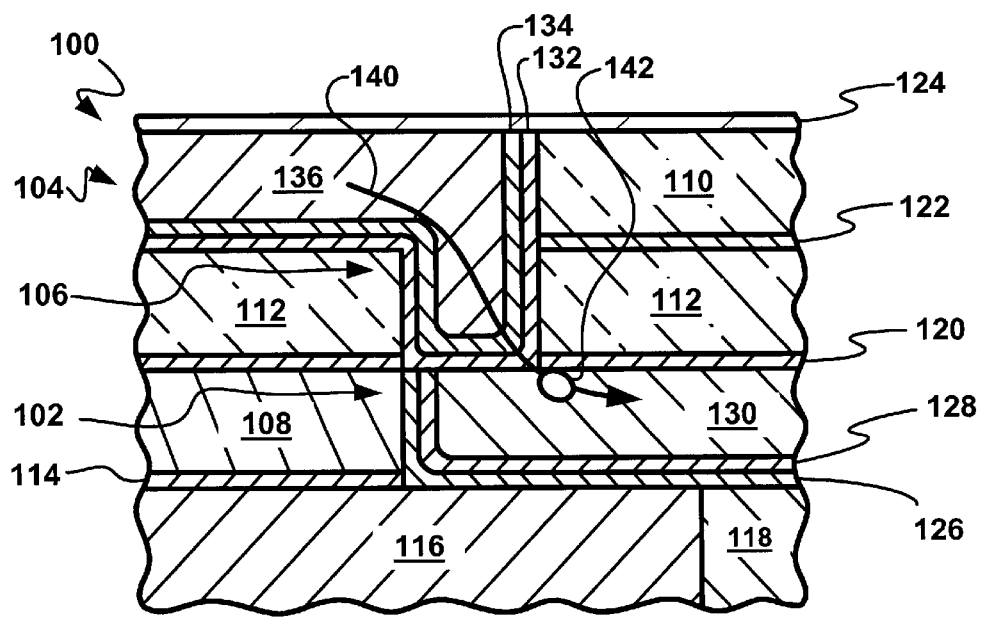
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or via stop layer 124.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

A major problem occurs in the channel at the base of the via 106. Voids such as a void 142 form due to current flow 140 where the flux diverges site coincides with the point where maximum current crowding occurs. It has been determined that the current crowding causes Joule heating to occur. Voids like the void 142 nucleate and increase in size due to atomic movement of conductor material, or electromigration (EM), due to electric current flow where there is a sudden change in direction. This electromigration is particularly problematic with copper conductor core materials and the sizes of the voids lead to increased circuit resistance and open circuit failures.

While studying the problem of electromigration and the mean time to failure (MTTF), it was determined that the MTTF could be modeled by Black's equation:

$$MTTF \alpha J^{-n} \exp(E_a/k_B \times T)$$

where:
 J=Current Density
 n=Current Exponent
 $E_a$=Activation Energy
 $k_B$=Boltzman's constant
 T=Effective temperature of metal line =$T_j + \Delta T$
  where:
   $T_j$ is the junction temperature
   $\Delta T$ equals Joule heating caused by current crowding.

Analyzing Black's equation, the increase in temperature caused by the Joule heating in the area around the void 142 can result in an exponential decrease in the electromigration lifetime.

Figure 3:
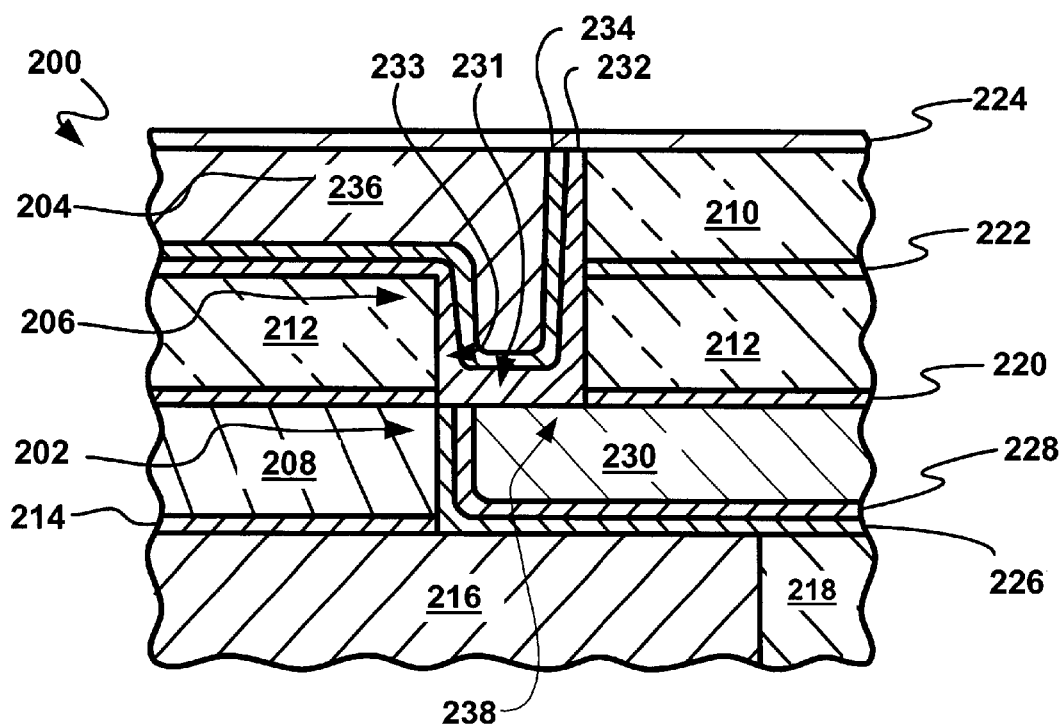
FIG. 3 is a cross-section of a semiconductor wafer of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

To avoid the effects from flux divergence, maximum current crowding, and Joule heating occurring at the same point, the discontinuity caused by the barrier material is eliminated by optimizing the barrier layer 232.

The barrier 232 is optimized by increasing the thickness of the bottom 231 over the first channel 202 and the thickness of the sides 233 on the sidewalls of the via dielectric 212 over the thickness outside of the via 206. The barrier 232 is additionally or alternatively optimized by tuning its resistivity. This may be accomplished by changing the concentration of such impurity materials as oxides and/or nitrides therein.

In various embodiments, the diffusion barrier layers are of materials such as tantalum (Ta), titanium (Ti), tungsten (W), alloys thereof, and compounds thereof. The seed layers (where used) are of materials such as copper (Cu), gold (Au), silver (Ag), compounds thereof and combinations thereof with one or more of the above elements. The conductor cores with or without seed layers are of conductor materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. An integrated circuit comprising:
 a substrate having a device provided thereon;
 a dielectric layer formed on the substrate having an opening provided therein said opening is a dual damascene opening comprising a via opening and a channel opening;
 a barrier layer to line the opening, the barrier layer thicker in the via opening than in the channel opening wherein current crowding will be reduced and Joule heating will be reduced compared to the barrier layer in the via portion having the same thickness as in the channel opening and
 a conductor core filling the opening and connected to the device.

2. The integrated circuit as claimed in claim 1 wherein the barrier layer is a pure refractory metal.

3. The integrated circuit as claimed in claim 1 wherein the barrier layer is a material selected from a group consisting of tantalum, titanium, tungsten, a compound thereof, and a combination thereof.

4. The integrated circuit as claimed in claim 1 wherein the conductor core is a material selected from a group consisting of copper, aluminum, gold, silver, a compound thereof and a combination thereof.

5. The integrated circuit as claimed in claim 1 wherein the forming the dielectric layer uses a low dielectric constant material having a dielectric constant under 3.9.

6. An integrated circuit comprising:
 a semiconductor substrate having a semiconductor device provided thereon;
 a first channel dielectric layer over the semiconductor substrate;
 a first channel opening in the first channel dielectric layer;
 a first barrier layer to line the first channel opening;
 a first conductor core over the first barrier layer to fill the opening and connect to the semiconductor device;
 a via dielectric layer over the first channel dielectric layer;
 a second channel dielectric layer over the via dielectric layer;
 a via opening in the via dielectric layer and a second channel opening in the second channel dielectric layer;

a second barrier layer to line the via opening and second channel opening, the second barrier layer thicker in the via opening than in the channel opening wherein current crowding will be reduced and Joule heating will be reduced compared to the second barrier layer in the via opening having the same thickness as in the second channel opening; and a second conductor core over the barrier layer to fill the via and second channel opening and connect to the semiconductor device.

7. The integrated circuit as claimed in claim 6 wherein the second barrier layer is an optimized barrier layer material having resistivity tuned to reduce current crowding, and reduce Joule heating over a pure refractory barrier layer material by having different proportions of impurities therein.

8. The integrated circuit as claimed in claim 6 wherein the first and second barrier layers are a material selected from a group consisting of tantalum, titanium, tungsten, a compound thereof, and a combination thereof.

9. The integrated circuit as claimed in claim 6 wherein the first and second conductor cores are a material selected from a group consisting of copper, aluminum, gold, silver, a compound thereof, and a combination thereof.

10. The integrated circuit as claimed in claim 6 wherein the forming the first channel, via, and second channel dielectric layer uses low dielectric constant materials having a dielectric constants under 3.9.

* * * * *